United States Patent
Niu et al.

(10) Patent No.: US 7,987,415 B2
(45) Date of Patent: Jul. 26, 2011

(54) METHOD AND SYSTEM FOR APPLICATION OF UNEQUAL ERROR PROTECTION TO UNCOMPRESSED VIDEO FOR TRANSMISSION OVER WIRELESS CHANNELS

(75) Inventors: Huaning Niu, Sunnyvale, CA (US); Pengfei Xia, Mountain View, CA (US); Chiu Ngo, San Franciso, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 1047 days.

(21) Appl. No.: 11/706,941

(22) Filed: Feb. 13, 2007

(65) Prior Publication Data

US 2007/0204205 A1    Aug. 30, 2007

Related U.S. Application Data

(60) Provisional application No. 60/773,827, filed on Feb. 15, 2006.

(51) Int. Cl.
    *H03M 13/00* (2006.01)
    *H04L 1/00* (2006.01)
    *G06F 11/00* (2006.01)
    *G08C 25/00* (2006.01)

(52) U.S. Cl. ........................... 714/799; 375/261
(58) Field of Classification Search .................. 714/799; 375/261
    See application file for complete search history.

(56) References Cited

U.S. PATENT DOCUMENTS

| | | | |
|---|---|---|---|
| 5,214,656 A | 5/1993 | Chung et al. | |
| 5,544,328 A * | 8/1996 | Seshadri | 375/261 |
| 5,987,069 A | 11/1999 | Furukawa et al. | |
| 6,031,874 A * | 2/2000 | Chennakeshu et al. | 375/262 |
| 6,154,499 A | 11/2000 | Bhaskar et al. | |
| 6,651,210 B1 | 11/2003 | Trott et al. | |
| 2001/0028684 A1* | 10/2001 | Chung et al. | 375/261 |
| 2002/0097697 A1 | 7/2002 | Bae et al. | |
| 2005/0180509 A1 | 8/2005 | Olivieri et al. | |
| 2007/0115797 A1* | 5/2007 | Reznic et al. | 370/203 |
| 2007/0183523 A1* | 8/2007 | Koo et al. | 375/261 |
| 2007/0198887 A1* | 8/2007 | Reznic et al. | 714/752 |

FOREIGN PATENT DOCUMENTS

CN    1364362    8/2002

OTHER PUBLICATIONS

Chinese Office Action mailed Jan. 22, 2010 in Chinese Patent Application No. 2007800055905, 12 pg., People's Republic of China. (English-language translation attached).

(Continued)

*Primary Examiner* — Sam Rizk
(74) *Attorney, Agent, or Firm* — Kenneth L. Sherman, Esq.; Michael Zarrabian, Esq.; Myers Andras Sherman & Zarrabian LLP (57) ABSTRACT

A method and system of wireless communication is provided which involves inputting information bits, wherein certain bits have higher importance level than other bits, and applying unequal protection to the bits at different importance levels. As such, important bits are provided with more protection for transmission and error recovery. Applying unequal protection involves using skewed constellations such that more important bits are provided with more error recovery protection.

19 Claims, 11 Drawing Sheets

OTHER PUBLICATIONS

Notification of Transmittal of the International Search Report and Written Opinion mailed May 23, 2007 in International Application No. PCT/KR2007/000831, 14 pp., Korean Intellectual Property Office, Republic of Korea.

Gallant, M. and Kossentini, F., "Rate-Distortion Optimized Layered Coding With Unequal Error Protection for Robust Internet Video," IEEE Transactions on Circuits and Systems for Video Technology, vol. 11, No. 3, pp. 357-372, Mar. 2001.

Mohr, A., Riskin, E., and Ladner, R., "Unequal Loss Protection: Graceful Degradation of Image Quality Over Packet Erasure Channels Through Forward Error Correction," IEEE Journal on Selected Areas in Communications, vol. 18, No. 6, pp. 819-828, Jun. 2000.

Calderbank, A. R. and Seshadri, N., "Multilevel codes for unequal error protection," IEEE Transactions on Information Theory, vol. 39, No. 4, July 1993, pp. 1234-1248.

Kim, J., "Channel Coding for Video Transmission over Unknown Channels", A dissertation submitted in partial satisfaction of the requirements for the degree of Doctor of Philosophy in Electrical Engineering, UCLA, 1996, 152 pp. (part 1 of 3, pp. 1-50).

Kim, J., "Channel Coding for Video Transmission over Unknown Channels", A dissertation submitted in partial satisfaction of the requirements for the degree of Doctor of Philosophy in Electrical Engineering, UCLA, 1996, 152 pages (part 2 of 3, pp. 51-100).

Kim, J., "Channel Coding for Video Transmission over Unknown Channels", A dissertation submitted in partial satisfaction of the requirements for the degree of Doctor of Philosophy in Electrical Engineering, UCLA, 1996, 152 pages (part 3 of 3, pp. 101-152).

Zehavi, E., "8-PSK trellis codes for a Rayleigh channel," IEEE Transactions on Communications, vol. 40, No. 5, May 1992, pp. 873-884.

Chinese Office Action dated Aug. 9, 2010 issued to Chinese Patent Application No. 200780005590.5 (English-language translation included). pp. 1-9, Haidian District, Beijing, China.

Chinese Office Action dated Nov. 24, 2010 in counterpart Chinese Patent Application No. 200780005590.5, 9 pages, China Patent Office, China [English-language translation attached, 18 pages].

Zhang, C. et al., "Digital Image Compression Coding," Jan. 31, 2006, Section 4.7, pp. 68-69, Tsinghua University Press, China [English-language translation attached, 4 pages].

* cited by examiner

FIG. 1 b0 b1 b2 b3

| 0010 | 0110 | 1110 | 1010 |
| ● | ● | ● | ● |

| 0011 | 0111 | 1111 | 1011 |
| ● | ● | ● | ● |

| 0001 | 0101 | 1101 | 1001 |
| ● | ● | ● | ● |

| 0000 | 0100 | 1100 | 1000 |
| ● | ● | ● | ● |

METHOD AND SYSTEM FOR APPLICATION OF UNEQUAL ERROR PROTECTION TO UNCOMPRESSED VIDEO FOR TRANSMISSION OVER WIRELESS CHANNELS

RELATED APPLICATION

This application claims priority from U.S. Provisional Patent Application Ser. No. 60/773,827, filed on Feb. 15, 2006, incorporated herein by reference.

FIELD OF THE INVENTION

The present invention relates to wireless communications and in particular, to video transmission over wireless channels.

BACKGROUND OF THE INVENTION

With the proliferation of high quality video, an increasing number of electronics devices (e.g., consumer electronics devices) utilize high-definition (HD) video, which has an overall data throughput requirement on the order of multiple Gbps. In most wireless communications, HD video is compressed first before transmission over a wireless medium. Compression of the HD video is attractive because the overall required communication bandwidth and power can be significantly reduced, relative to transmission of the original, uncompressed video. However, with each compression and subsequent decompression of the video, some video information can be lost and the picture quality is degraded. Furthermore, compression and decompression of the video signal incurs significant hardware cost.

It is desirable to transmit uncompressed HD video in certain scenarios. The High-Definition Multimedia Interface (HDMI) specification defines an interface for uncompressed HD transmission between devices through HDMI cables (wired links). Three separate channels are used to transmit three pixel component streams (e.g., R, B, G). For each channel, pixels are transmitted in a pixel-by-pixel order for each video line and line-by-line for each video frame or field. The HDMI provides pixel-repetition functionality which repeats each pixel one or multiple times. Copies of each pixel directly follow the original pixel during the transmission at each pixel component channel.

However, existing Wireless Local Area Networks (WLANs) and similar technologies do not have the bandwidth needed to support uncompressed HD video. Further, existing wireless networks may suffer from undesirable interference originated from nearby/neighboring devices, either in the same network or in other networks. As such, new frequency bands are needed for transmission of uncompressed HD video over wireless channels.

Further, forward error correction (FEC) codes are widely used in wireless communication systems for error protection and allow correction of bit errors due to noise, channel fading as well as other system imperfections. Normally, all information bits have equal importance and are thus equally protected. However, for communication of uncompressed video, the information bits have different levels of priority in terms of importance of visual information they represent. Losing higher priority bits in transmission, results in more visual degradation than lower priority bits. There is, therefore, a need for a method and a system for efficient, reliable transmission of uncompressed HD video wirelessly.

BRIEF SUMMARY OF THE INVENTION

The present invention provides a method and a system for efficient and reliable process for communication of uncompressed video over wireless channels, wherein certain bits have higher importance level than other bits.

In one embodiment, such a communication process involves applying unequal protection to the bits at different importance levels such that important bits are provided with more protection for transmission and error recovery. Applying unequal protection further includes applying unequal protection to bits at different importance levels using skewed constellations such that more important bits are provided with more protection for transmission error recovery. As such, an unequal error protection (UEP) scheme is implemented using asymmetric coding and/or asymmetric constellation mapping for wireless transmission of video signals, and in particular wireless transmission of uncompressed HD video.

The UEP mechanism enables efficient communication of video such as uncompressed HD video over communication links such as wireless channels.

These and other embodiments, aspects and advantages of the present invention will become understood with reference to the following description, appended claims and accompanying figures.

DETAILED DESCRIPTION OF THE INVENTION

The present invention provides a method and a system for efficient and reliable transmission of uncompressed video over wireless channels. An unequal error protection (UEP) scheme is implemented using asymmetric coding and/or asymmetric constellation mapping for wireless transmission of video signals, and in particular wireless transmission of uncompressed HD video.

One implementation involves inputting information bits, wherein certain bits have higher importance (priority) than other bits, and applying unequal error protection using FEC codes, to the bits according to importance levels of the information bits. FEC codes encode information bits by adding some redundancy bits. Both the original information bits and the redundancy bits are transmitted from a transmitter over the wireless channel and collected at a receiver. The receiver then determines the type of information bits. Using the redundancy bits, at least a portion of the bit errors can be corrected, leading to a controllable bit error rate.

Apart from FEC codes, error protection of the information bits can also be controlled by adjusting constellation mapping of the FEC-encoded bits, which equivalently changes signal-to-noise ratio (SNR) of the targeted information bits. It is straightforward that higher SNR would lead to better error protection of the information bits.

Since as mentioned uncompressed video bits have different importance levels, applying UEP by adding strong protection for important bits and less strong protection for less important bits, the important bits can be corrected at the receiver without the need for retransmission from the transmitter, thereby improving efficiency.

In one implementation, different coding rates are used for the most significant bit (MSB) and the least significant bit (LSB) information. Additional unequal error protection is achieved with constellation mapping wherein an asymmetric constellation mapping is used for wireless transmission.

An example of an unequal error protection scheme using priority encoding and constellation mapping, for wireless transmission of uncompressed video according to the present invention is described below. In this example, uncompressed video is represented by 24 bits per pixel (i.e., 8 bits per pixel component such as Red, Green, and Blue). Uncompressed video can also be represented by 30 bits per pixel, corresponding to 10 bits per pixel component Red, Green, and Blue, or by 36 bits per pixel, corresponding to 12 bits per pixel component Red, Green, and Blue. Representation of uncompressed video by more or less bits is also possible and the present invention is not limited to any particular representation.

Bits at higher video importance levels have a more significant contribution in terms of video information than bits at lower video importance levels. In this example, where uncompressed video is represented by 24 bits per pixel, among the 8 bits per pixel component, the MSB is at a higher importance level than the LSB. Let bit 7 be the most significant bit and bit 0 be the least significant bit. Bits 7, 6, 5, 4 thus are more important than bits 3, 2, 1, 0. For this reason, stronger error protection is applied to bits 7, 6, 5, 4, while less strong (or no) error protection is applied to bits 3, 2, 1, 0. In this example, unequal error protection is realized by an asymmetric Quadrature Amplitude Modulation (QAM) symbol mapping.

Figure 1:
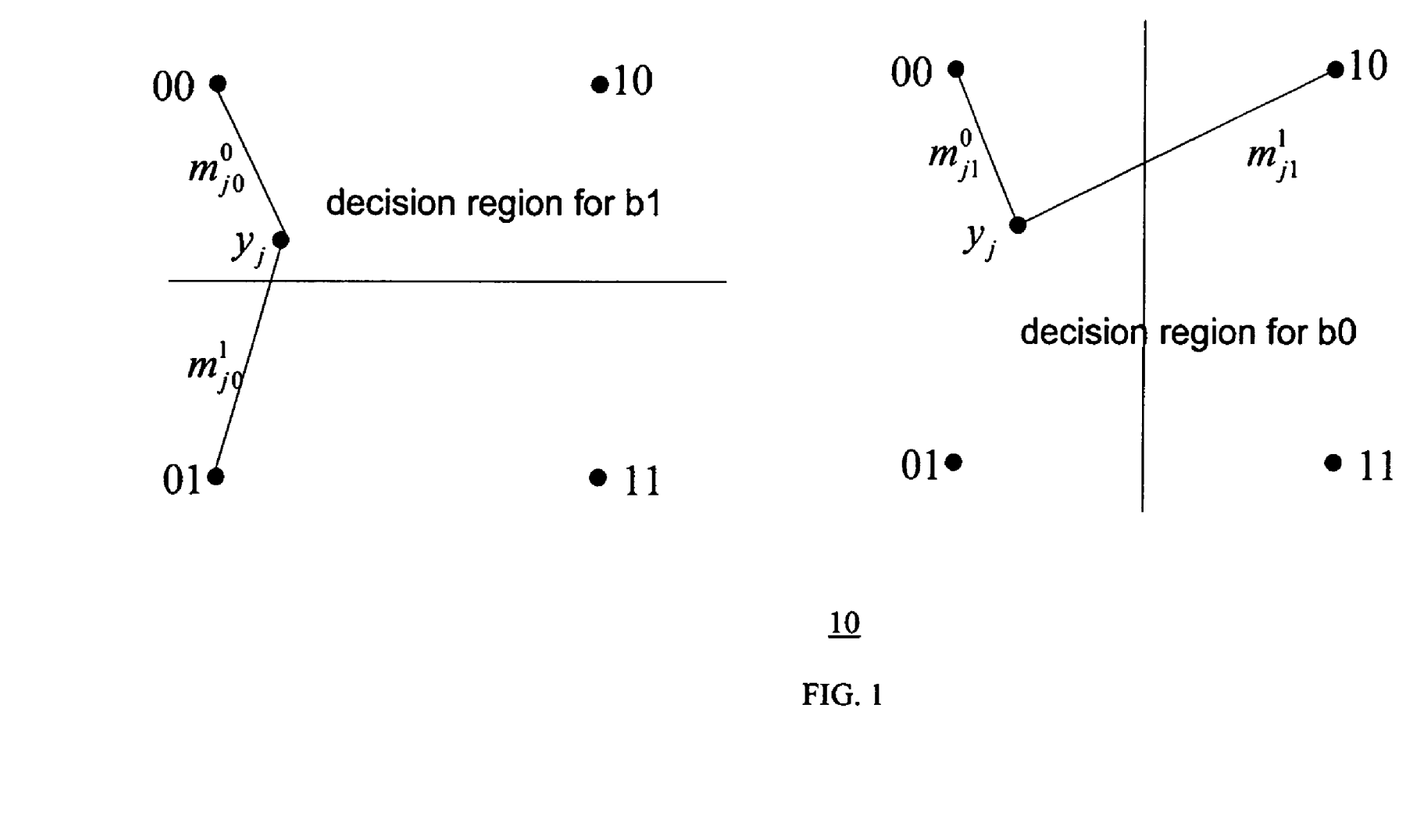
FIG. 1 shows a conventional constellation distance computation for QPSK modulation, in a wireless communication system.

The communication system input-output model in the example can be represented as y=hs+n, wherein y represents the received signal, h represents complex wireless channel coefficient, s represents a transmitted symbol selected from the constellation according to the input information bits, and n represents additive white Gaussian noise. At the receiver side, soft bit decision decoding metrics can be calculated by finding the distance between the received symbol y and all the constellation points via the log-likelihood ratio (LLR) per (1):

$$LLR_{ji} = m_{ji}^1 - m_{ji}^0 = \min_{a \in C_i^1} \|y_j - ha\|^2 - \min_{a \in C_i^0} \|y_j - ha\|^2 \quad (1)$$

where $C_i^p$ represents the subset of the constellation points such that for every constellation point in this subset, bit i is equal to value p with p∈{0,1}. FIG. 1 shows a diagrammatical example of a conventional distance computation process 10 using Quadrature Phase Shift Keying (QPSK) modulation. Each constellation point (shown as a solid circle ●) is represented by two binary bits b0, b1. FIG. 1 also shows the decision regions for bits b0 and b1.

Figure 2:
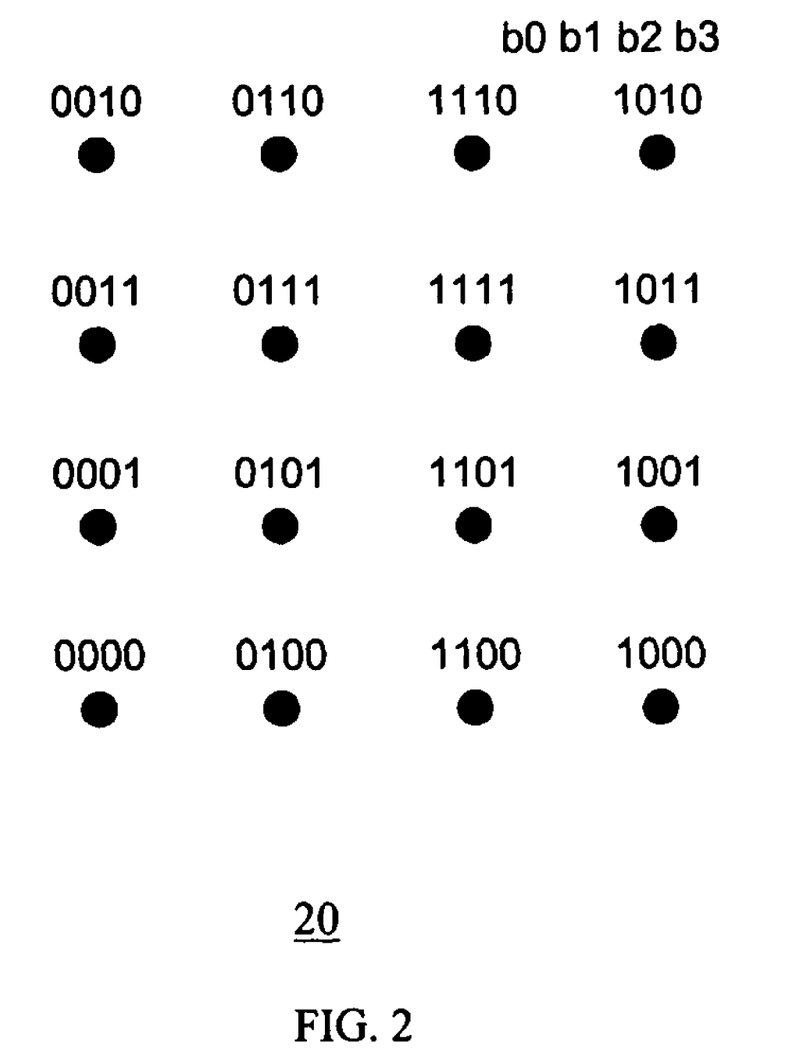
FIG. 2 shows a conventional Gray coded 16 QAM constellation.
Figure 3:
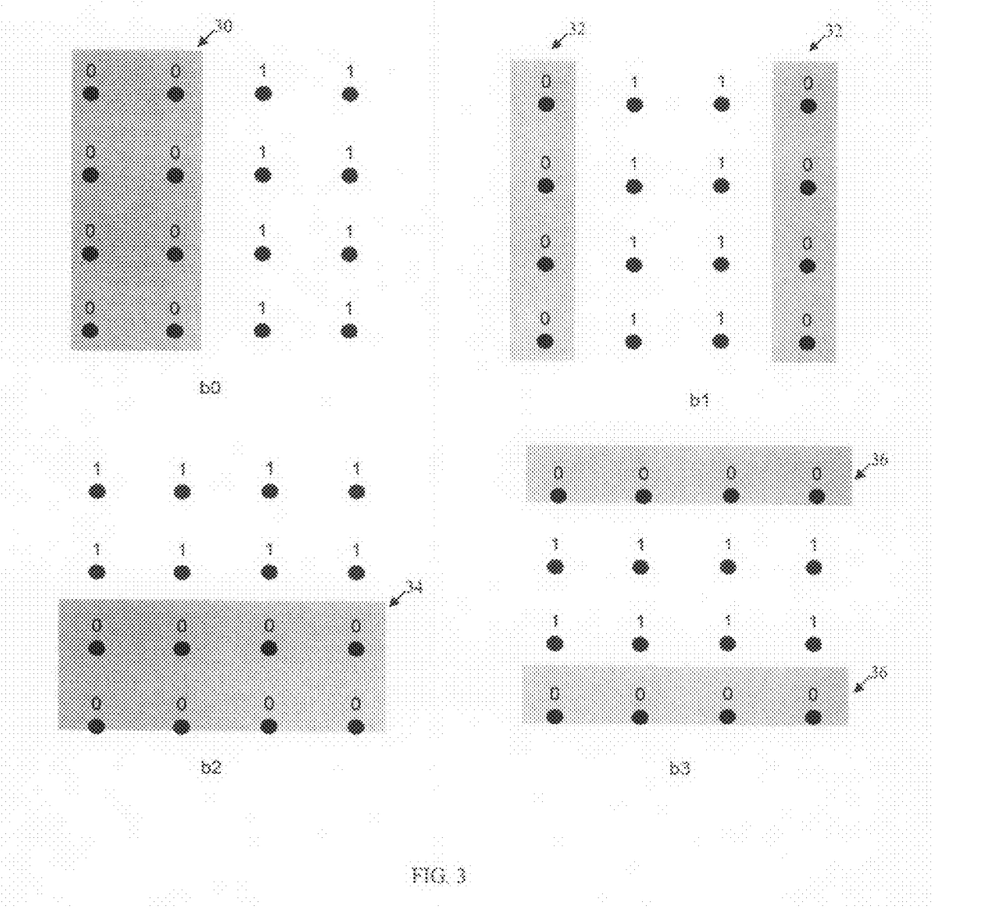
FIG. 3 shows decision regions used for calculating soft decision metrics for soft Viterbi decoding of the received symbols in FIG. 2.

FIG. 2 shows a conventional Gray coded 16 QAM constellation, while FIG. 3 shows decision regions used for calculating soft decision metrics for soft Viterbi decoding of received symbols in FIG. 2. For a regular QPSK constellation mapping, all four constellation points form a symmetric square shape, with regard to the center of the constellation. It can be shown that such a symmetric QPSK mapping leads to equal error protection for all information bits. Because different bits of the video signal have different priority, applying equal error protection would either lead to under-protection for MSBs, or over-protection for LSBs which causes inefficiency.

Figure 4:
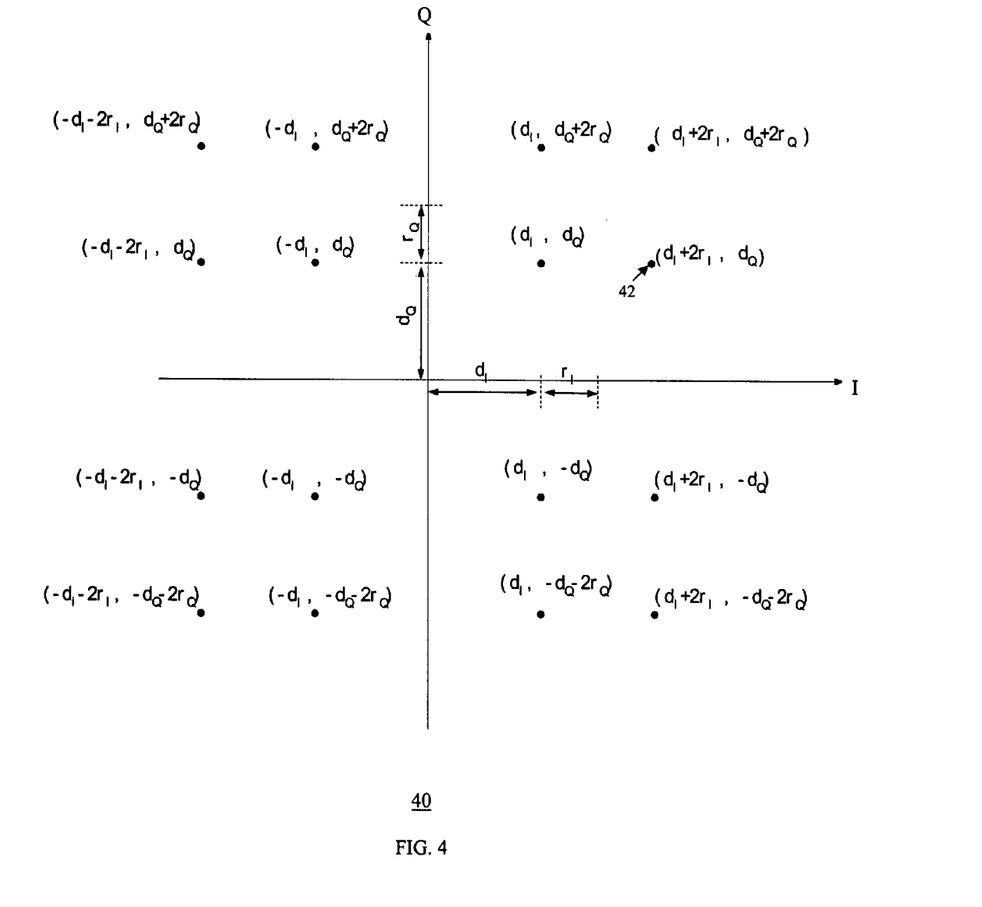
FIG. 4 shows a 16 QAM constellation example wherein the constellation points are determined by four independent design parameters for unequal error protection, according to an embodiment of the present invention.

According to the present invention, shape of the constellation can be optimized, which typically leads to an asymmetric constellation mapping, to provide unequal error protection for different bits. Particularly, unequal error protection is achieved by skewed constellation mapping such as those shown in FIGS. 4-6. FIG. 4 shows a 16 QAM UEP example constellation 40 wherein the 16 constellation points 42 (shown as solid circles ●) are represented as {($d_I$+$r_I$±$r_I$, $d_Q$+$r_Q$±$r_Q$), (−$d_I$−$r_I$±$r_I$, $d_Q$+$r_Q$±$r_Q$), (−$d_I$−$r_I$±$r_I$, −$d_Q$−$r_Q$±$r_Q$), ($d_I$+$r_I$±$r_I$, −$d_Q$−$r_Q$±$r_Q$)}, which are determined by four independent design parameters {$d_I$, $r_I$, $d_Q$, $r_Q$}.

A constellation point is transmitted through two separate and orthogonal channels. For example, to transmit the constellation point 42 ($d_I$+2$r_I$, $d_Q$), the x-axis component (or the I-component), $d_I$+2$r_I$, is transmitted over one channel (also known as the I-channel), and the y-axis component (or the Q-component), $d_Q$, is transmitted over another channel (also known as the Q-channel), which is orthogonal to the I-channel. In the special case where parameters $d_I$=$r_I$=$d_Q$=$r_Q$, a perfect square 16 QAM is achieved.

Note that there are two cases of unequal error protection in general. In the first case, by having $d_I$=$r_I$=$d_Q$=$r_Q$ not valid, unequal error protection is created on purpose for different bits on the I channel and the Q channel. In the second case, even with $d_I$=$r_I$=$d_Q$=$r_Q$ valid, certain degree of unequal error protection still exists for different bits on the I channel and the Q channel. This can be evidenced from FIGS. 2 and 3. FIG. 2 shows an example of a Gray coded (Gray labeled) square 16 QAM constellation 20 with $d_I$=$r_I$=$d_Q$=$r_Q$, and FIG. 3 shows the decision regions 30, 32, 34, and 36 for the four bits b0, b1, b2, and b3, respectively, of each symbol, for calculating the soft decision metrics in soft Viterbi symbol decoding. Bits b0 and b2 have only one closest neighbor while bits b1 and b3 have 2 closest neighbors. Normally, the closer the neighbors are, the higher the likelihood of an incorrect decoding decision. Therefore, it is less likely that bits b0, b2 will be mistakenly decoded and thus, bits b0 and b2 are better protected than bits b1 and b3.

The difference between said two cases of creating unequal error protection is that the first case can control the degree of error protection disparity by adjusting the system parameters $d_I$, $r_I$, $d_Q$, $r_Q$, while the second case has to live with fixed degree of error protection disparity. Furthermore, the first case for unequal error protection can be applied for all possible constellations, while the second case for unequal error protection can not be applied toward QPSK constellation mapping. In the following example, the first case is utilized for application of unequal error protection, due its flexibility in adjusting error protection disparity. By choosing different design parameters $d_I$, $r_I$, $d_Q$, $r_Q$, different constellation shapes can be generated, and different levels of unequal error protection can be provided to data on the I and Q channels.

Figure 5:
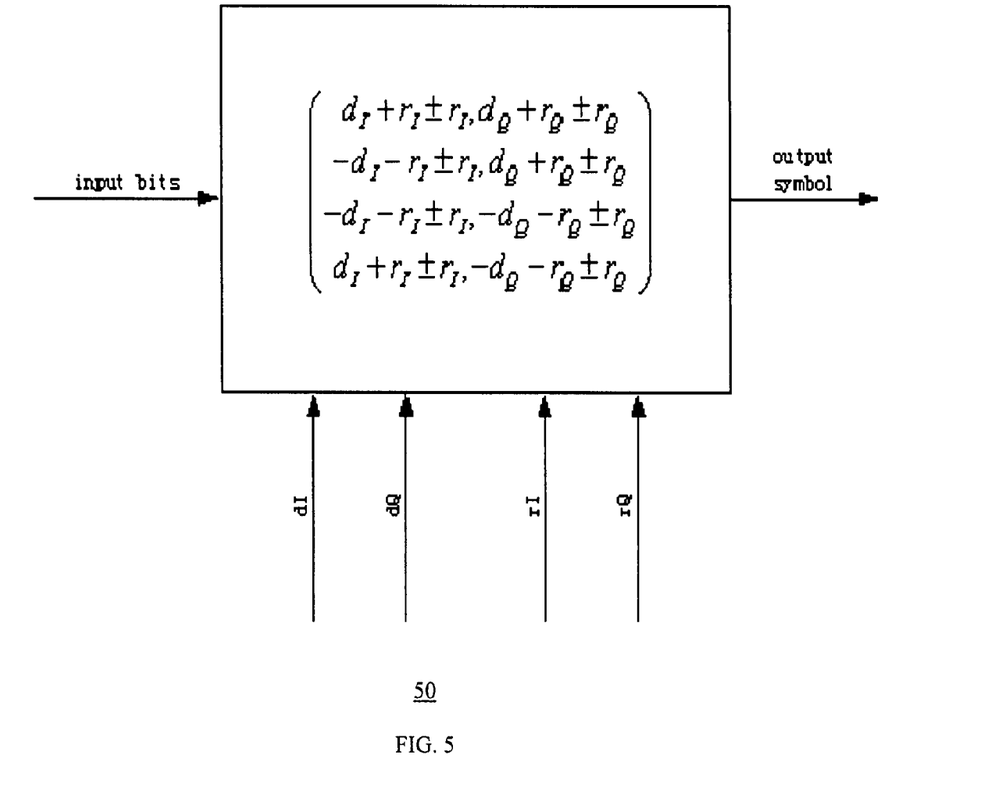
FIG. 5 shows an[sN1] unequal error protection function module which maps input bits to output constellations, according to an embodiment of the present invention.

FIG. 5 shows an example UEP function 50 for mapping input bits to output constellations based on the four independent parameters $\{d_I, r_I, d_Q, r_Q\}$. Many different UEP schemes can be developed by changing the four independent parameters $\{d_I, r_I, d_Q, r_Q\}$. One example of UEP mapping is defined by: $d_I = d_Q$ and $r_I = r_Q$, whereby for each two bits on the I channel (or the Q channel), the bits are unequally protected. The resulting constellation generally has a square shape.

Figure 6:
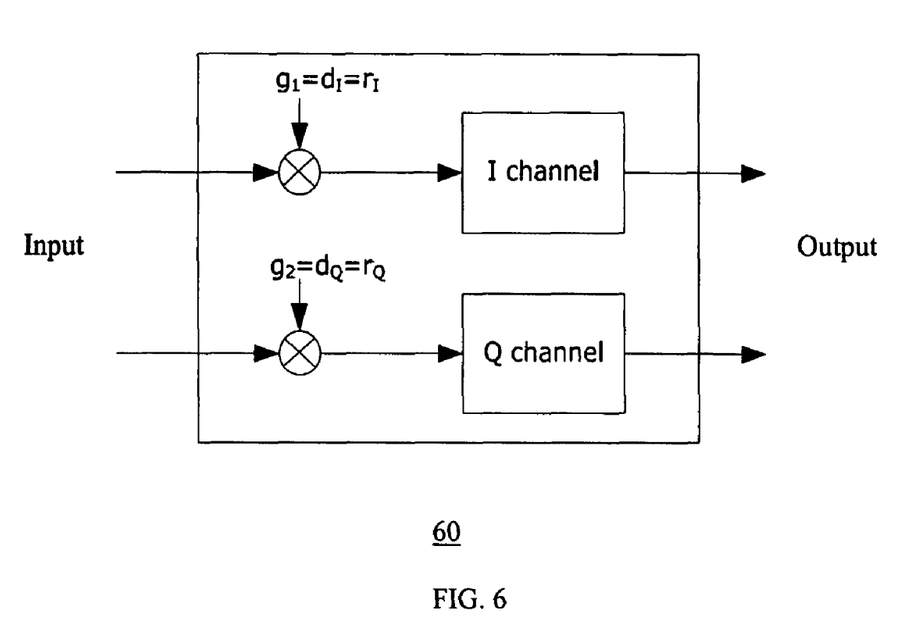
FIG. 6 shows another example of an unequal error protection function module, according to an embodiment of the present invention.

Another example of UEP mapping is defined by: $d_I = r_I$ and $d_Q = r_Q$, whereby every two bits on the same channel (either I or Q channel) are equally protected relative to each other. However, the bits on the I channel as a whole, are provided with different protection than the bits on the Q channel as a whole. The resulting constellation generally has a rectangular shape. FIG. 6 shows an example function 60 for the second example UEP mapping scheme (i.e., $d_I = r_I$, $d_Q = r_Q$), utilizing gain parameters $g1 = d_I = r_I$ and $g2 = d_Q = r_Q$ for adjusting the error protection level for the I channel and the Q channel, respectively. In FIG. 6, the inputs are the I and Q components (i.e., above-mentioned x-axis and y-axis components) for the current constellation point before the application of UEP. The I and Q components are multiplied by the gain factors g1 and g2, respectively, to generate I and Q component outputs with UEP applied thereto.

Though in the above two example UEP mapping schemes, 16 QAM modulation is used as an example, as those skilled in the art will recognize, similar UEP mapping schemes can be developed for 64 QAM and other modulations.

Figure 7A:
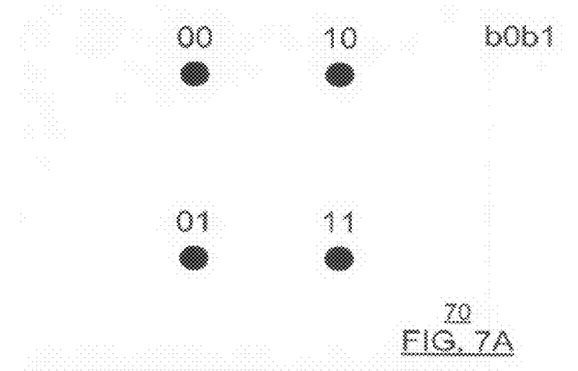
FIGS. 7A-B show examples of unequal error protection constellations for QPSK modulation, together with the decision regions, according to an embodiment of the present invention.
Figure 7B:
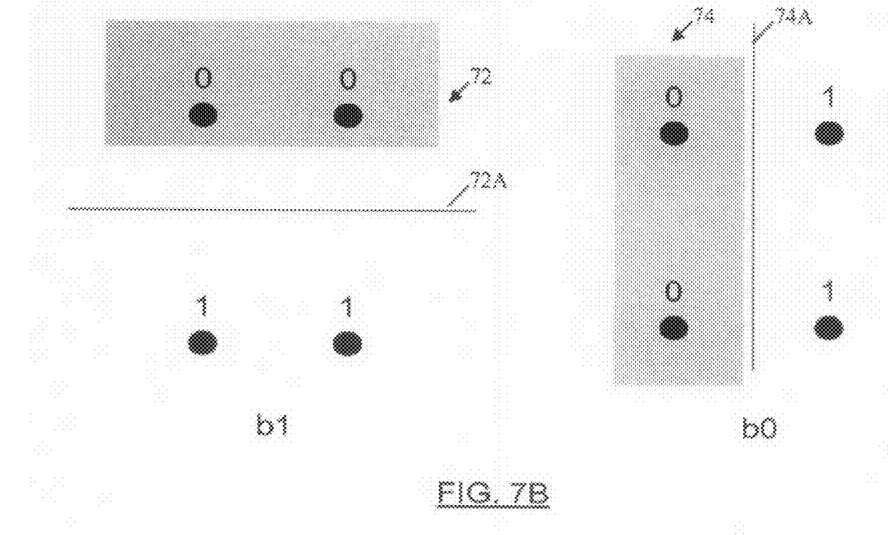

Example applications of UEP for a QPSK constellation are diagrammatically shown in FIGS. 7A-B, according to the present invention. Specifically, FIG. 7A shows the QPSK constellation 70 with enhanced unequal error protection, and FIG. 7B shows decision regions 72 and 74 for the bits b1 and b0, respectively. For bit b1, all the received symbols above the horizontal 72A line are decided as b1=0. Similarly for bit b0, all the received symbols fall left of the vertical line 74A are decided as b0=0. As the distance between 0 and 1 for b1 is larger than b0, bit b1 is more protected than bit b0.

Figure 8A:
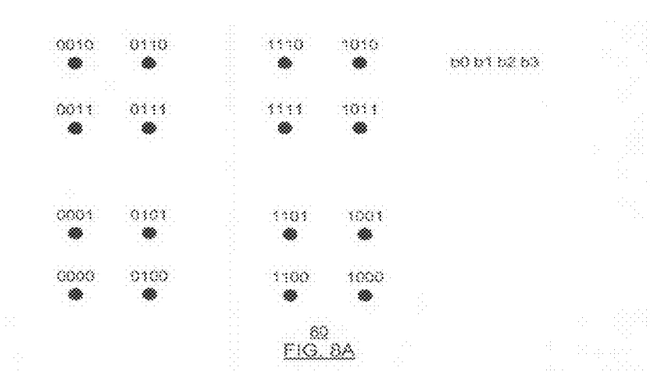
FIGS. 8A-B show examples of unequal error protection constellations for 16 QAM modulation, together with the decision regions, according to the present invention.
Figure 8B:
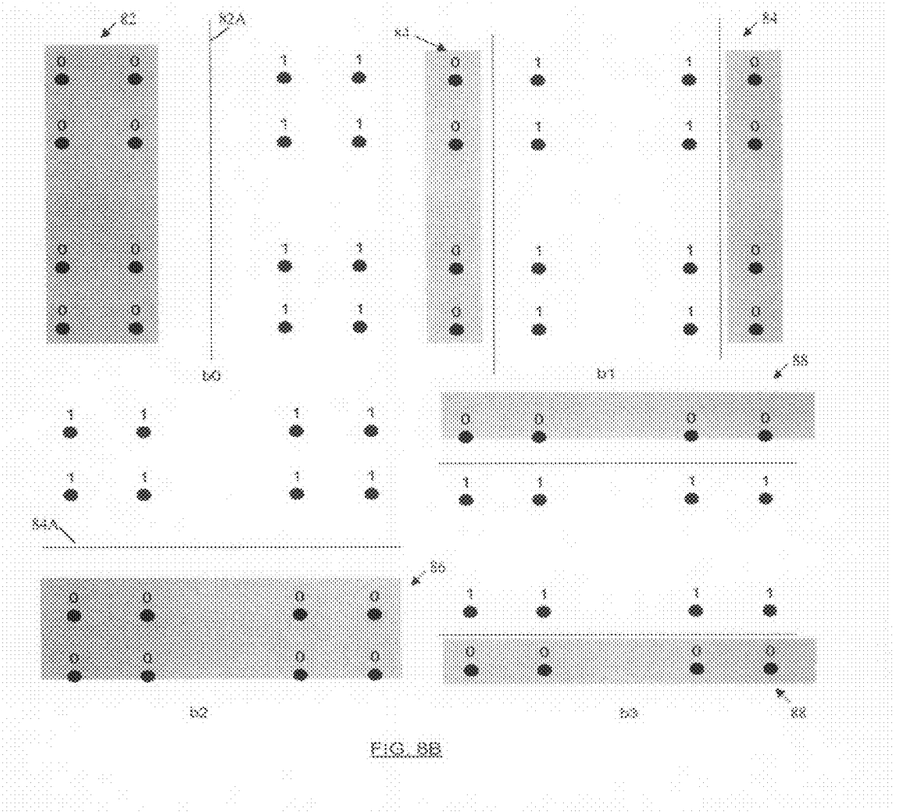

Example applications of UEP for a 16 QAM constellation are diagrammatically shown in FIGS. 8A-B, according to the present invention. Specifically, FIG. 8A shows a 16 QAM constellation 80 with unequal error protection and FIG. 8B shows the decision regions 82, 84, 86 and 88 for bits b0, b1, b2 and b3, respectively, for the constellation 80. In FIG. 8B, bits b0 and b2 are more protected than bits b1 and b3. For bit b0, all the received symbols falling to the left of the vertical line 82A are decided as 0. Similarly for b2, all of the received symbols below the horizontal line 84A are decided as 0. On the other hand, for bit b1, the inner distance between 0 and 1 is much shorter compared to b0 and b2, which provides less error protection for b1 compared to b0 and b2. Bit b3 has the same error performance as b1. For a 64 QAM constellation, similar unequal protection can also be applied, as those skilled in the art will recognize. Particularly for 16 QAM constellation mapping, FIG. 3 shows the conventional constellation mapping scheme, while FIG. 8B shows the corresponding UEP constellation mapping scheme according to the present invention.

A wireless communication system, according to the present invention, functions by inputting information bits for transmission from a transmitter to a receiver over a wireless channel. Because certain input bits have higher importance levels than other bits, unequal protection is applied to the bits at different importance levels, such that more important bits are provided with more protection for transmission and error recovery. Applying unequal protection involves using skewed constellations, such that more important bits are provided with more error recovery protection.

The input bits are parsed into different data paths and encoded based on importance level. The encoded bits from different paths are then multiplexed into one stream using a selected multiplexing pattern. Then skewed constellation mapping is applied in order to generate unequal protection to coded bits according to their respective importance levels. As such, more important bits are provided with more protection for transmission to provide better error recovery.

The skew-mapped bits are transmitted as symbols over a wireless channel. At a receiver, the received symbols are processed using decision decoding metrics and demodulation, to determine the transmitted information bits.

Figure 9:
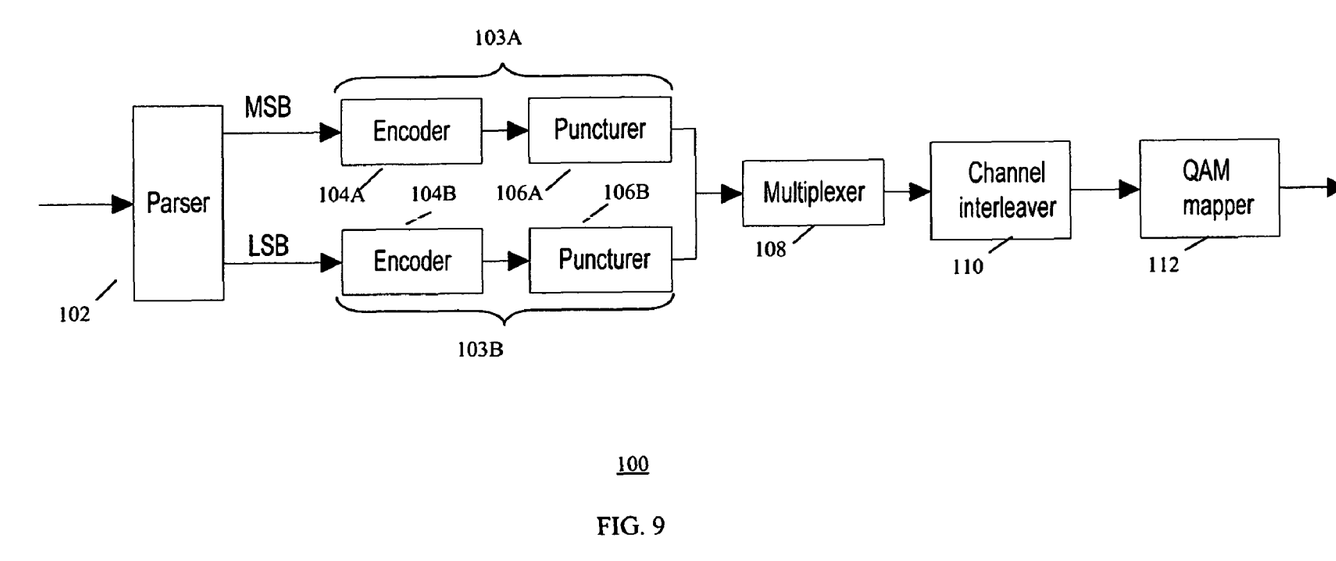
FIG. 9 shows a functional block diagram of an encoding section of a transmitter in a wireless communication system employing unequal error protection, according to an embodiment of the present invention.

FIG. 9 shows a functional block diagram of an encoding section 100 of an example transmitter in such a wireless communication system employing unequal error protection, according to the present invention.

The encoding section 100 includes a parser 102, two data paths 103A and 103B, a multiplexer 108, an interleaver 110 and a QAM mapper 112. The first data path 103A includes a FEC encoder 104A and a puncturer 106A. The second data pattern 103B includes a FEC encoder 104B and a puncturer 106B.

The parser 102 separates an input bit stream into two spatial streams, a MSB stream for the first data path 103A and a LSB stream for the second data path 103B. In the first data path 103A, the FEC encoder 104A can be a rate 1/2 convolutional code (or can be a convolutional code with some other rate or can be some other code) and the puncturer 106A is used to puncture the coded MSB bits to change the overall coding rate for MSBs. In the second data path 103B, the encoder 104B can be a rate 1/2 convolutional code as well (or can be a convolutional code with some other rate or can be some other code) and the puncturer 106B is used to puncture the bits to change the coding rate for LSBs. In this example, the four coded MSBs (i.e., bits 7, 6, 5, 4 of each 8 bit pixel component) are mapped to bits b0 and b2 of the 16 QAM constellation, and the four coded LSBs (i.e., bits 3, 2, 1, 0) are mapped to bits b1 and b3 of the 16 QAM constellation. Different mappings and/or more than two (2) streams are also possible.

Specifically, the parser 102 receives a video data stream from a higher layer, and for every 8 bits inside each color of a pixel, parses 4 MSBs (i.e., bits 7, 6, 5, 4) to the first data path 103A, and parses the other 4 LSBs (i.e., bits 3, 2, 1, 0) to the second data path 103B. Depending on the video data format from the higher layer, the parser 102 can be either a bit parser or a group parser.

Each data path then performs FEC encoding and puncturing. Each data path can utilize different codes and puncturing patterns, than the other data paths, depending on bit importance level. Further, although only two data paths are shown in FIG. 9, the present invention contemplates parsing input bits into more than two data paths, depending on the number of importance levels for the bits (e.g., the number of data paths can be equal to the number of importance levels). The punctured and encoded bits are then provided to the multiplexer 108.

The MSBs and LSBs may be coded at different coding rates on the data paths 103A and 103B, resulting in a differing number of coded bits on the two data paths 103A and 103B. A multiplexer is utilized in handling any data rate mismatch over the two data paths.

The channel interleaver 110 provides channel interleaving, in order to decorrelate the adjacent channel coefficients and to reduce the overall error rate probability. The interleaving operation preserves the bit pattern of MSBs and LSBs. The QAM mapper 112 may use either a standard non-skewed constellation mapping (e.g., FIGS. 2 and 3) or a skewed unequal error protection constellation (e.g., FIGS. 4-6). The detailed constellation design and labeling (i.e., how asymmetrical the constellation is) depends on the channel condition and implementation, and can be configured by system parameters, (e.g., $\{d_I, r_I, d_Q, r_Q\}$) for the 16 QAM modulation.

Figure 10:
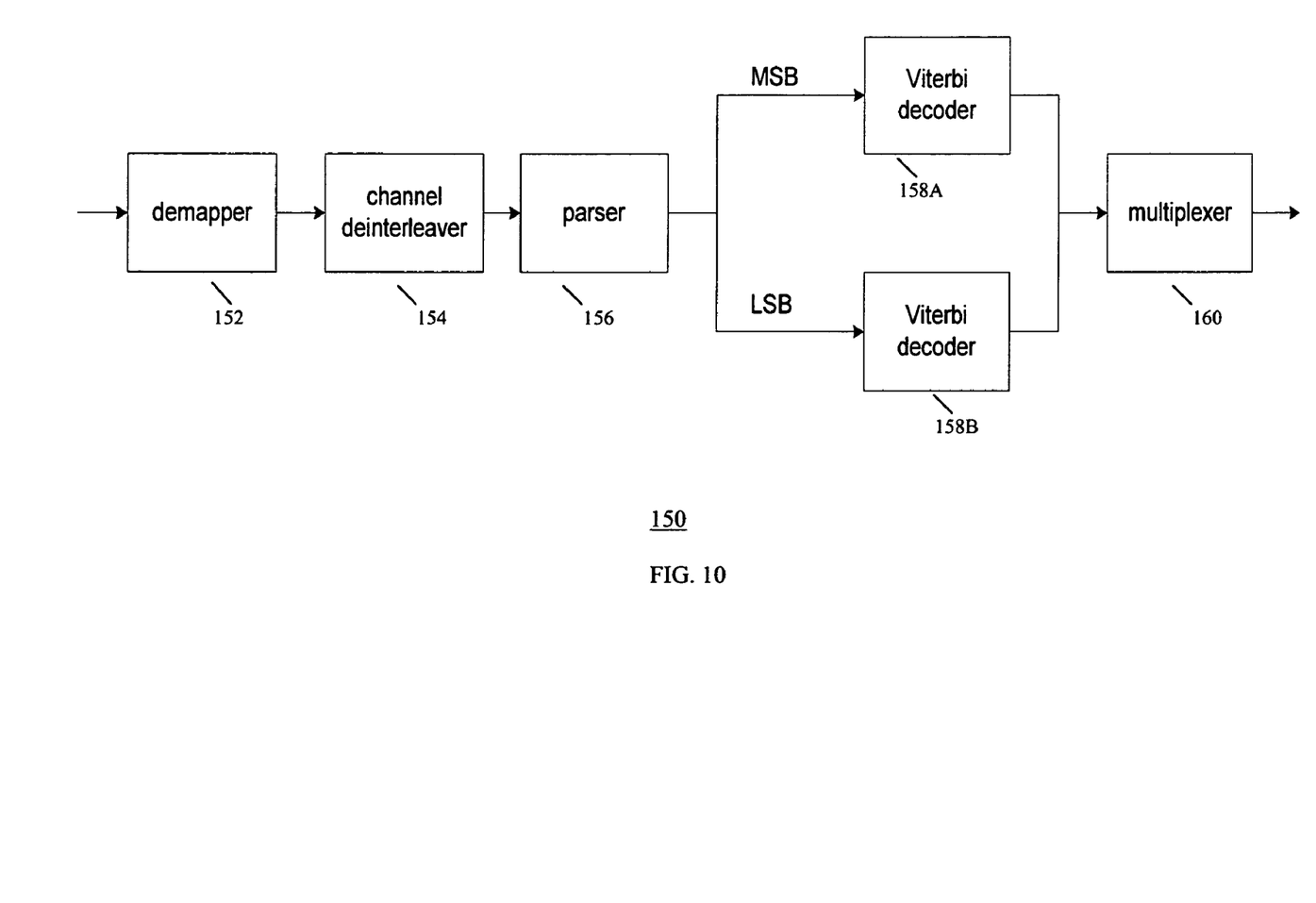
FIG. 10 shows a functional block diagram of an example receiver.

Referring to FIG. 10, an example receiver 150 according to the present invention performs the reverse steps of the transmitter. A demapper 152 demaps (or demodulates) received symbols into demodulated binary bits. The demapper can 152 can implement either a hard decision or a soft decision process. The demodulated bits are then deinterleaved by a channel deinterleaver 154 to restore bits into their original positions. A parser 156 then de-parses the deinterleaved bits into two or more bit streams, each bit stream including bits of different levels of importance in relation to other bit streams (e.g., bit stream 1 including bits of importance level 1, ..., bit stream n including bits of importance level n). In the example of FIG. 10, two bit streams MSB and LSB are shown. Each bit stream is decoded by a corresponding FEC decoder (e.g., the Viterbi decoder). As such, the MSB bit stream is decoded by a decoder 158A and the LSB bit stream is decided by a decoder 158B. The separately decoded bits are multiplexed together by a multiplexer (de-multiplexer) 160 to recover the transmitted information.

Figure 11:
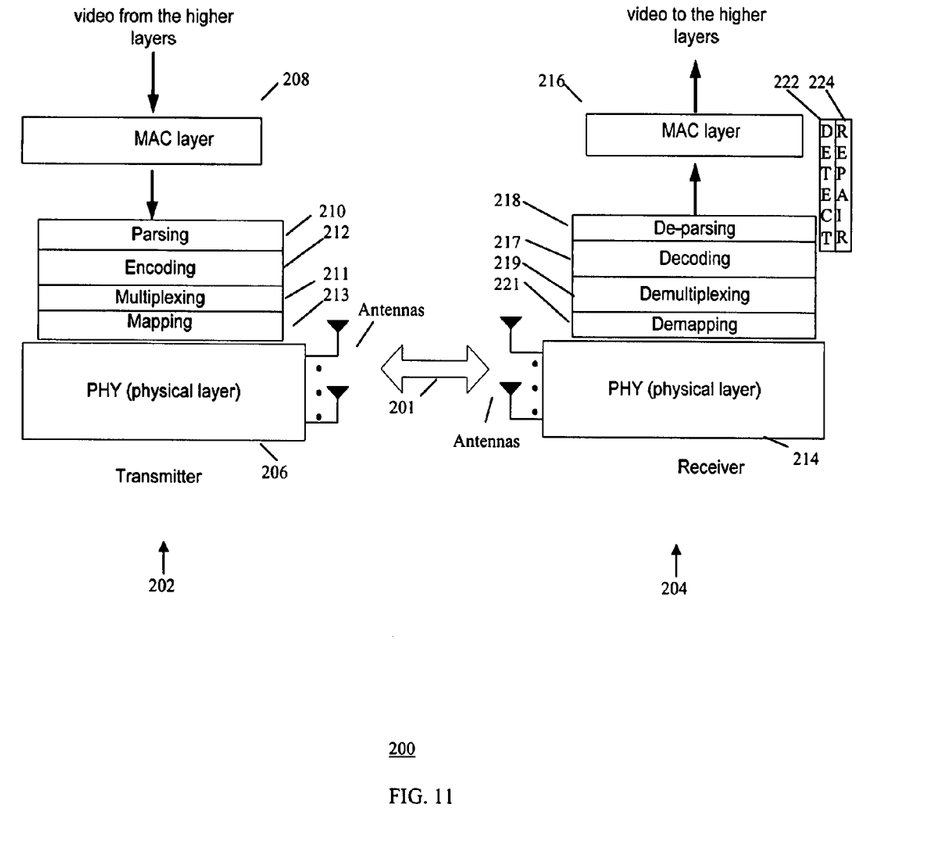
FIG. 11 shows a functional block diagram of an example wireless communication system, according to an embodiment of the present invention.

FIG. 11 shows a functional block diagram of an example wireless communication system 200, according to an embodiment of the present invention, including a wireless communication station 202 functioning as a transmitter (a sender) and a wireless communication station functioning as a receiver 204, which implements an example process for communicating uncompressed video, as discussed above. The transmitter 202 includes a PHY layer 206 and a MAC layer 208. Similarly, the receiver 204 includes a PHY layer 214 sand a MAC layer 216. The PHY and MAC layers provide wireless communication between the transmitter 202 and the receiver 204 via antennas through a wireless channel 201.

The transmitter 202 further includes: a parsing module 210 parsing input video bits into separate streams based on importance level, such as the function of the above-mentioned parser 102 (FIG. 9); an encoding module 212 implementing encoding on the different bit streams, such as the function of the above-mentioned encoders 104A, 104B; a multiplexing module 211 that combines the encoded bit stream into one stream, such as the function of the multiplexing module 108; a mapper module 213 that performs constellation mapping using skewed constellations for unequal error protection, such as the functions of the QAM mapper 112. The bits are then converted to frequency band signals transmitted by the PHY layer 206 via one or more antennas over the wireless channel 201 to the receiver 204. The steps of parsing, encoding, multiplexing and mapping takes place in the PHY layer 206.

In the wireless receiver 204, the PHY layer 214 receives the signals and converts them to bits. A de-mapping module 221 then demaps the received bits by implementing the reverse steps of the mapping module 213 of the transmitter. Then, the demultiplexing module 219 de-multiplexes the bits into different streams at different priority levels by reverse steps of the multiplexer 211. A decoding module 217 then decodes the bits in each stream by reverse steps of the encoding module 212. A de-parsing module 218 then de-parses the multiple bit streams into one video bit stream by reverse steps of the parsing module 210, thereby reconstructing the transmitted vide. The steps of de-parsing, decoding, demultiplexing and demapping takes place in the PHY layer 214.

The receiver 204 further includes an error detection module 222 and an error correction module 224. The error detection module 222 detects lost or damaged bits (e.g., using Cyclic Redundancy Code (CRC) information provided by the transmitter). The correction module 224 utilizes the encoding and UEP information to compensate for the lost or damaged bits.

Although in relation of FIG. 11, the stations 202 and 204 have been described as a transmitter and a receiver, respectively, each is a type of wireless communication station (as noted) capable of transmitting and/or receiving over a wireless channel in a wireless communication system. Therefore, a wireless communication station herein can function as a transmitter, a sender, a receiver, an initiator and/or a responder. As such, the present invention provides unequal error protection without significant additional implementation cost and improves the uncompressed video quality.

As is known to those skilled in the art, the aforementioned example architectures described above, according to the present invention, can be implemented in many ways, such as program instructions for execution by a processor, as logic circuits, as an application specific integrated circuit, as firmware, etc.

The present invention has been described in considerable detail with reference to certain preferred versions thereof; however, other versions are possible. Therefore, the spirit and scope of the appended claims should not be limited to the description of the preferred versions contained herein.

What is claimed is:

1. A method of wireless uncompressed High Definition (HD) video communication, comprising the steps of:
   inputting uncompressed HD video information bits, wherein certain bits have a higher importance level than other bits;
   parsing the bits based on their importance levels; and
   applying unequal protection to bits at different importance levels using skewed constellation mapping by performing quadrature amplitude modulation (QAM) skewed constellation mapping, such that more important bits are provided with more protection for transmission error recovery, wherein applying unequal protection using skewed constellation mapping further includes performing quadrature phase shift keying (QPSK) skewed constellation mapping to bits b0, b1, wherein: for bit b1, all of the received symbols in a decision region are decided as b1=0, and for bit b0, all of the received symbols in another decision regions are decided as b0=0, wherein as the distance between 0 and 1 for b1 is larger than b0, the bit b1 is more protected than bit b0.

2. The method of claim 1 wherein applying unequal protection using skewed constellation mapping further includes performing 16-QAM skewed constellation mapping to bits b0, b1, b2, b3 such that: for bit b0, all of the received symbols in decision regions are decided as 0, and for bit b2, all of the received symbols in another decision regions are decided as 0, wherein for bit b1, the inner distance between 0 and 1 is much shorter compared to that for bits b0 and b2, which provides less error protection for b1 compared to b0 and b2, and bit b3 has the same error performance as b1.

3. The method of claim 1 wherein:
each constellation point is transmitted through two separate and orthogonal channels, I-channel and Q-channel, in 16-QAM modulation, and
the constellation mapping is represented as a set $\{(d_I+r_I\pm r_I, d_Q+r_Q\pm r_Q), (-d_I-r_I\pm r_I, d_Q+r_Q\pm r_Q), (-d_I-r_I\pm r_I, -d_Q-r_Q\pm r_Q), (d_I+r_I\pm r_I, -d_Q-r_Q\pm r_Q)\}$, based on independent design parameters $\{d_I, r_I, d_Q, r_Q\}$, wherein the bits are unequally protected.

4. The method of claim 3 wherein UEP mapping is performed with $d_I=r_I$, $d_Q=r_Q$, utilizing gain parameters $g1=d_I=r_I$ and $g2=d_Q=r_Q$ for adjusting the error protection level for the I-channel and the Q-channel, respectively, such that I and Q components are multiplied by the gain factors g1 and g2, respectively, to generate I and Q component outputs with unequal error protection (UEP) applied thereto.

5. A transmitter configured for transmitting communication signals using the method of claim 1.

6. A receiver configured for receiving communication signals using the method of claim 1.

7. A system configured for communicating signals using the method of claim 1.

8. A method of wireless uncompressed High Definition (HD) video communication, comprising the steps of:
inputting uncompressed HD video information bits, wherein certain bits have a higher importance level than other bits;
parsing the bits based on their importance levels; and
applying unequal protection to bits at different importance levels using skewed constellation mapping by performing quadrature amplitude modulation (QAM) skewed constellation mapping, such that more important bits are provided with more protection for transmission error recovery, wherein applying unequal protection using skewed constellation mapping further includes performing 16-QAM skewed constellation mapping to bits b0, b1, b2, b3 such that: for bit b0, all of the received symbols in decision regions are decided as 0, and for bit b2, all of the received symbols in another decision regions are decided as 0, wherein for bit b1, the inner distance between 0 and 1 is much shorter compared to that for bits b0 and b2, which provides less error protection for b1 compared to b0 and b2, and bit b3 has the same error performance as b1.

9. A transmitter configured for transmitting communication signals using the method of claim 8.

10. A receiver configured for receiving communication signals using the method of claim 8.

11. A system configured for communicating signals using the method of claim 1.

12. A method of wireless uncompressed High Definition (HD) video communication, comprising the steps of:
inputting uncompressed HD video information bits, wherein certain bits have a higher importance level than other bits;
parsing the bits based on their importance levels; and
applying unequal protection to bits at different importance levels using skewed constellation mapping by performing quadrature amplitude modulation (QAM) skewed constellation mapping, such that more important bits are provided with more protection for transmission error recovery, wherein:
each constellation point is transmitted through two separate and orthogonal channels, I-channel and Q-channel, in 16-QAM modulation, and
the constellation mapping is represented as a set $\{(d_I+r_I\pm r_I, d_Q+r_Q\pm r_Q), (-d_I-r_I\pm r_I, d_Q+r_Q\pm r_Q), (-d_I-r_I\pm r_I, -d_Q-r_Q\pm r_Q), (d_I+r_I\pm r_I, -d_Q-r_Q\pm r_Q)\}$, based on independent design parameters $\{d_I, r_I, d_Q, r_Q\}$, wherein the bits are unequally protected.

13. A transmitter configured for transmitting communication signals using the method of claim 12.

14. A receiver configured for receiving communication signals using the method of claim 12.

15. A system configured for communicating signals using the method of claim claim 12.

16. A method of wireless uncompressed High Definition (HD) video communication, comprising the steps of:
inputting uncompressed HD video information bits, wherein certain bits have a higher importance level than other bits;
parsing the bits based on their importance levels; and
applying unequal protection to bits at different importance levels using skewed constellation mapping by performing quadrature amplitude modulation (QAM) skewed constellation mapping, such that more important bits are provided with more protection for transmission error recovery, wherein UEP mapping is performed with $d_I=r_I$, $d_Q=r_Q$, utilizing gain parameters $g1=d_I=r_I$ and $g2=d_Q=r_Q$ for adjusting the error protection level for the I-channel and the Q-channel, respectively, such that I and Q components are multiplied by the gain factors g1 and g2, respectively, to generate I and Q component outputs with unequal error protection (UEP) applied thereto.

17. A transmitter configured for transmitting communication signals using the method of claim 16.

18. A receiver configured for receiving communication signals using the method of claim 16.

19. A system configured for communicating signals using the method of claim claim 16.

* * * * *